United States Patent
Nowak et al.

(10) Patent No.: US 6,172,558 B1
(45) Date of Patent: Jan. 9, 2001

(54) SWITCHING AMPLIFIER AND METHOD FOR OPERATING SAME

(75) Inventors: Stefan Nowak, Braeuningshof; Robert Bleisteiner, Dormitz, both of (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/388,602

(22) Filed: Sep. 2, 1999

(51) Int. Cl.[7] ....................................................... H03F 3/38
(52) U.S. Cl. ............................................. 330/10; 330/251
(58) Field of Search ............................. 330/10, 146, 150, 330/207 A, 251; 363/41, 98

(56) References Cited

U.S. PATENT DOCUMENTS

| | | | |
|---|---|---|---|
| 4,369,409 | 1/1983 | Kyrian et al. | 330/10 |
| 5,111,378 | 5/1992 | Nowak et al. | 363/98 |
| 5,163,174 | * 11/1992 | Beeken | 330/10 |
| 5,546,299 | 8/1996 | Lenz | 363/71 |
| 5,578,971 | * 11/1996 | Minami et al. | 330/10 X |

FOREIGN PATENT DOCUMENTS

| | | |
|---|---|---|
| 34 38 034 | 4/1986 | (DE) . |
| 38 22 990 | 1/1990 | (DE) . |
| 40 17 207 | 12/1991 | (DE) . |
| WO 95/10881 | 4/1995 | (WO) . |

* cited by examiner

*Primary Examiner*—Steven J. Mottola
(74) *Attorney, Agent, or Firm*—Schiff Hardin & Waite

(57) ABSTRACT

A switching amplifier operable in a switched mode has a common-mode charging current which arises due to charge reversals in the conductor to ground and coupling capacitances. In order to make this charging current easily filterable, in a switching amplifier and a method for operating a switching amplifier, n successively connected cascade elements are provided n being odd and greater than equal to three, and a control unit drives comparable switch elements in the individual cascade elements so that these comparable switch elements are driven offset from cascade element-to-cascade element by 1/n times the switching period.

12 Claims, 11 Drawing Sheets

SWITCHING AMPLIFIER AND METHOD FOR OPERATING SAME

BACKGROUND OF THE INVENTION

1. Field of the Invention

The present invention relates to a switching amplifier operating a switching amplifier, of the type having a cascade of cascade elements of the same type numbering three or more, whereby each cascade element being a single-phase, fully controlled power inverter bridge with switch elements, and to a method for operating such a switching amplifier. The invention is suitable for use in all types of switching amplifiers. In particular, for medical devices, particularly MR tomography devices. In the latter case, the switching amplifier is used as a gradient amplifier for purposes of supplying gradient coils with current.

2. Description of the Prior Art

In the operation of MR tomography devices, among other things, rapidly switched magnetic fields with a constant gradient are generated by gradient coils. Each gradient coil has a current therein which attains values of up to 300 A or more in an exactly specified curve profile, for example. The current curve often has steep edges. To achieve the necessary high current rates of change, it is necessary to apply voltages of up to 2 kV or more at the gradient coils.

Typical gradient coil amplifiers which are in use today have switch regulators whose output-stage transistors are operated directly with the required voltages and switching frequencies. However, with current technologies, this is possible only for voltages up to approximately 600 V and switching frequencies up to approximately 25 kHz and requires a high outlay and spatial demand even within these limits. Power semiconductor switches that can switch more than 800 V with the required steepness, given the arising current strengths, are currently unavailable.

U.S. Pat. No. 5,546,299 teaches connecting at least two controllable voltage sources in series at the output side of a power supply for predominantly inductive loads for generating pulse-like high output currents with a steep controlled pulse rise. Each voltage source has at least one voltage-setting unit, such as a single-phase inverter bridge, and a voltage-divided direct voltage source. The switched mode of the voltage-setting units is controlled by control units, for instance by a pulsewidth modulation. A voltage source for basic load operation for delivering a basic load output voltage, and at least one voltage source for peak-load operation for delivering peakload output voltages, which exceed the basic load output voltage, are connected in series. In another embodiment, two voltage sources for the peak-load operation are driven with chronologically staggered switching signals, so that the effective switching frequency for the total output voltage is increased and the ripple of the load current at the output side is smaller than given non-staggered driving. Moreover, the control dynamic is correspondingly larger.

German OS 40 17 207 teaches a mechanism for supplying a consumer dipole with direct current that is predominantly free of harmonics but which can still be varied rapidly. To this end, n direct-voltage step-down setters of the same type are cascaded. The direct-voltage step-down setters are driven according to the principle of pulsewidth modulation, thereby shifting the uniformly high cycle frequency from step-down setter to step-down setter by 1/n times the period duration, respectively.

PCT Application WO 95/10881 teaches a switching amplifier wherein a number of output stages in the form of controllable voltage sources are likewise connected in series. The switch cycles of the output stages here are likewise staggered relative to one another such that the effective switching frequency of the output voltage is increased.

These three cited references respectively describe a staggered driving of the individual cascade elements of a switching amplifier so that the effective switching frequency at the cascade output is higher than the switching frequency of individual cascade elements, or switch elements. This means an increased control dynamic and, given a constant load inductance, a lower ripple of the load current, or of the cascade output voltage. It is also possible to shift undesirable harmonic portions of the load current to higher frequencies by switched mode operation thereby facilitating their filtering effect.

Particularly in MR tomography devices, it is important that the gradient currents follow the prescribed curves (i.e., set amplitude values at set times) exactly. Deviations from the preset curves, such as due to undesirable harmonic portions that are not filtered out, lead to a significant degradation of the MR image quality.

Besides the harmonics described above, circulating currents, what are known as common-mode charging currents, are caused by charge reversals of conductor-to-ground and coupling capacities occur during switched mode operation of a switching amplifier, also are superimposed on the charging current.

SUMMARY OF THE INVENTION

An object of the present invention is to provide a switching amplifier, and a method for operating a switching amplifier, wherein noise portions contained in the output quantity of the switching amplifier are easy to filter, and wherein disturbances of other subassemblies are avoided.

The object is inventively achieved in a switching amplifier fashioned as a cascade of elements of the same type, each cascade element containing a singlephase, fully controlled power inverter bridge with switch elements, a control mechanism that controls all switch elements with a uniform switching frequency by pulsewidth modulation, the number n of the cascade elements being odd and greater than or equal to three, and the control mechanism drives comparable switch elements of the individual cascade elements such that the driving is offset from element to element by 1/n times the switching period.

The object is achieved in a method for operating a switching amplifier containing a cascade of elements of the same type numbering three or more, wherein each cascade element is a single-phase, fully controlled power inverter bridge with switch elements, including the steps of employing a switched mode of an odd number n of cascade elements greater than or equal to three, driving the switch elements of all switched cascade elements with a uniform switching frequency by pulsewidth modulation and staggering the driving of comparable switch elements from switched cascade element to switched cascade element by 1/n times the switching period.

Due to the odd number, greater than or equal to three, of cascade elements, together with the specific staggering of the drive of the switched cascade elements relative to one another, not only is the effective switching frequency of the output voltage increased in known fashion, but also the charge reversals of conductor-to-ground and coupling capacities of the switching amplifier and charging circuit are controlled so that the common-mode charging current, which arises in the overall load circuit due to the charge reversal processes of the capacitances in switched mode operation of the amplifier, has a base frequency which is a multiple of the switching frequency of the switch elements. The operational sign of this base frequency alternates from pulse to pulse of the output voltage. The strict periodicity and the comparably high base frequency of the thus set common-mode charging current create the necessary conditions for a simple and economical filtering by means of low-pass filters, so that a disturbing influence on the load does not take place. It is known that the cost for low-pass filtering devices decrease dramatically with increasing limit frequency.

In an embodiment the power inverter bridges and direct voltage sources connected thereto are constructed so as to be potential-free. It is thus possible to set both a negative and a positive output voltage of the switching amplifier.

In an other embodiment, the electrical reference voltage as well as the energy delivery and acceptance capability of the direct voltage source is the same for all cascade elements, or i.e., the cascade elements contribute equally to the output voltage of the switched amplifier. It is thus guaranteed that, both in the magnetizing and in the demagnetizing of an inductive load, the energy is derived from or fed back into all cascade elements symmetrically. Measures for energy symmetrization between the cascade elements are not necessary, and the switching amplifier behaves as a high-value, four-quadrant actuator. Given rapid changes in the preset curve for the output voltage of the switched amplifier, a different loading of the cascade elements can arise in a short time (within one switching period). These differences do not matter, however, since, averaged over time, they are distributed to all cascade elements uniformly.

In another embodiment, the cascade elements generate two cascade element voltage pulses in each switching period, which are separated by an unbiased switch state of the corresponding cascade element. The two voltage impulses at the output of a cascade element respectively produced by different ones of two possible voltageoutput states of the bridge. In the voltage-output states, two switch elements of a cascade element are respectively electrically conductive due to driving thereof, so that the voltage of the direct voltage source is impressed onto the load circuit as a driving voltage either in the positive or negative direction. The two unbiased switch states are characterized by two respective switch elements of a bridge being electrically conductive due to driving thereof, so that for a load current there is an unimpeded conduction through the cascade element. In one of the unbiased switch states, the through-connection is connected to the positive pole, and in the other of the unbiased switch states, it is connected to the negative pole.

DESCRIPTION OF THE PREFERRED EMBODIMENTS

Figure 1:
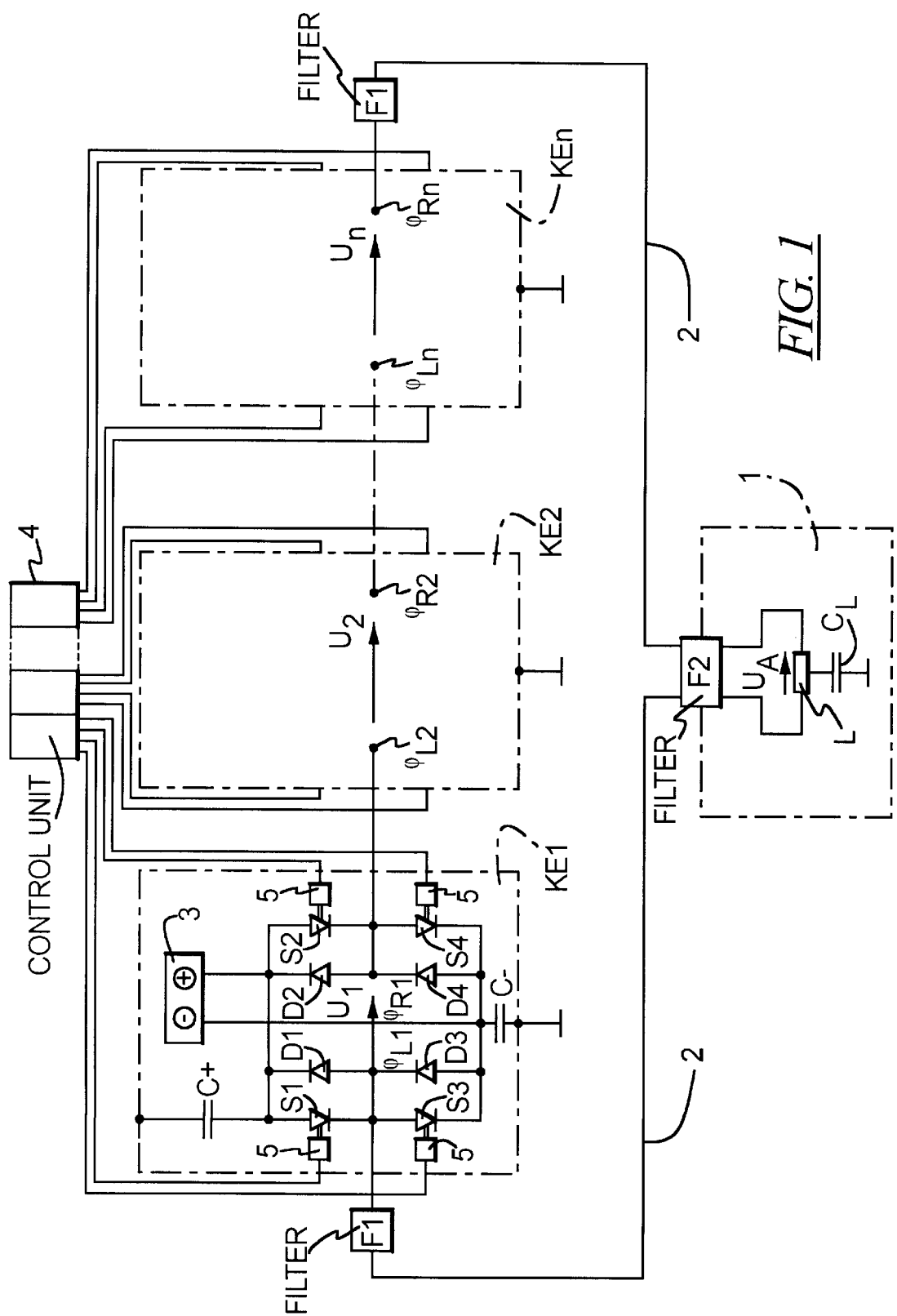
FIG. 1 is a circuit diagram of a switching amplifier in accordance with the invention in an embodiment as gradient amplifier for a gradient coil of a MR tomography device.

As an exemplary embodiment, FIG. 1 depicts a switching amplifier that is constructed in a cascade form as a gradient amplifier of an MR tomography device. The switching amplifier has n cascade elements of the same type KE1, KE2, . . . KEn. The number n of switched cascade elements is odd and greater or equal to three. The cascade elements are connected in series at the output side and are connected to a load L, which is a gradient coil. The corresponding cascade element voltages $U_1, U_2 \ldots U_n$ are allocated to the cascade elements KE1, KE2 . . . KEn. Their sum yields the output voltage $U_A$, across the load L, of the switching amplifier; thus $U_A = U_1 + U_2 + \ldots U_n$. Given that the maximum output voltage $U_A$ to be attained is approximately 2 kV and given a reasonable cascade element voltage of several 100 V, in an embodiment of the invention the number of cascade elements is three, five or seven. In other embodiments, even greater numbers are provided. Part of the magnetic resonance tomography device, with the gradient coils, is located in a space 1 which is shielded from high-frequency interference, in particular. The switching amplifier is arranged outside this space 1. The energy supply lines 2 from the switching amplifier to the gradient coil have a filter F2 with a low-pass characteristic at the transition into the shielded space 1. Additional filters F1 are located at the outputs of the switching amplifier. Undesirable harmonics generated by the switched mode of the amplifier are thus filtered and current through the load is smoothed. In other embodiments, each cascade element of the amplifier has a filter F1. Furthermore, the capacitances $C_+$, $C_-$ and $C_L$ are exemplarily illustrated in FIG. 1 for the distributed conductor-to-ground, or coupling capacitances of the switching amplifier and the load circuit connected thereto.

The structure and function of the cascade elements is described as an example for cascade element KE1. The other cascade elements KE2 to KEn are constructed analogously to the cascade element KE1. Each cascade element contains a singlephase, fully controlled power inverter bridge in known fashion, at which a direct voltage source 3 is connected. A power inverter bridge has four switch elements S1, S2, S3, and S4, for instance IGBTs (Insulated Gate Bipolar Transistor) or power transistors, to which unbiased diodes D1, D2, D3 and D4 are connected in parallel fashion. Pairs of switch elements S1 and S3, and S2 and S4, are connected in series, forming respective branches of the bridge between the two poles of the direct voltage. Respective drives 5 are allocated to the switch elements. The cascade element voltage $U_1$ is tapped at the bridge's transverse branch. For purposes of generating both a positive and a negative cascade element voltage $U_1$, the power inverter bridge and the direct voltage source 3 are floating.

The drives 5 are driven by a control device 4 that is shared by all cascade elements and that makes available pulsewidth-modulated control signals to all switch elements. The control device is depicted as being formed from a number of modules, each module being allocated to a respective cascade element. In other embodiments, the control device is constructed as a unified subassembly.

In the operation of the switching amplifier, the bridge circuits are driven according to pulsewidth-modulation methods that are known. In principle, any number of different methods can be employed, however, it is preferable to utilize modulation methods as described in detail in German OS 34 38 034 and U.S. Pat. No. 5,111,378.

It is important that, for comparable switch elements of the individual cascade elements, the switching frequency of the switch elements, on which the pulsewidth modulation is based, is staggered chronologically, resulting in a multiplication of the effective switching frequency of the output voltage $U_A$. The switching frequency of the switch elements equals 10 kHz, for example, so that the effective switching frequency of the output voltage $U_A$ always amounts to the n-multiple thereof. Comparable switch elements of the individual cascade elements are inventively controlled with a time shift from cascade element to cascade element equal to the switching period divided by the number of cascade elements. In other words, they are controlled with a phase shift of 360°/n relative to one another.

If a constant setpoint for the output voltage $U_A$, is assigned the individual cascade elements are driven with identical control signal patterns and generate voltage pulses of identical width, excluding the time shift. Given a setpoint assignment which varies over time, the voltage pulse widths of the individual cascade elements within a switching period are not equal. Averaged over time, however, the average voltage pulsewidth of the individual cascade elements is equal, so that the overall load is evenly distributed to all cascade elements, and energy symmetrization measures involving great outlay are unnecessary.

The characteristics of a modulation method wherein each switching period of a cascade element is divided into four segments are detailed below. Each segment is characterized by a switch state, there being an S1-S2 unbiased switch state, an S3-S4 unbiased switching state, an S1-S4 voltage-producing state, and an S2-S3 voltage-producing state. These four operating states are detailed below for the cascade element KE1 as an example.

In the S1-S2 unbiased switch state, the switch elements S1 and S2, and their associated unbiased diodes D1 and D2, conduct; the switch elements S3 and S4 being in a non-conductive state. The load circuit conducting through the cascade element KE1 is thus coupled to the positive pole of the direct voltage source 3. Accordingly, the left and right cascade element potentials $\phi_{L1}$ and $\phi_{R1}$ are defined as equal by the potential of the positive pole of the direct voltage source 3. Accordingly, the cascade element voltage $U_1$ equals zero.

In the S3-S4 unbiased switch state, the switch elements S3 and S4, and their associated unbiased diodes D3 and D4, conduct; the switch elements S1 and S2 being in a non-conductive state. The load circuit conducting through the cascade element KE1 is thus coupled to the negative pole of the direct voltage source 3. Accordingly, the left and the right cascade element potentials $\phi_{L1}$ and $\phi_{R1}$ are defined as equal by the potential of the negative pole of the direct voltage source 3. Accordingly, the cascade element voltage $U_1$ is zero.

The S1-S4 voltage-producing state is characterized by the switch elements S1 and S4 being in a conductive state, and the switch elements S2 and S3 being in a non-conductive state. The left cascade element potential $\phi_{L1}$ is thus determined by the potential of the positive pole of the direct voltage source 3, and the right cascade element potential $\phi_{R1}$ is determined by the potential of the negative pole of the direct voltage source 3. Accordingly, corresponding to the specified direction convention, the cascade element voltage $U_1$ is equal to the positive direct voltage.

The S2-S3 voltage-producing switch state is characterized by the switch elements S2 and S3 being in a conductive state and the switch elements S1 and S4 being a non-conductive state. The left cascade element potential $\phi_{L1}$ is thus determined by the potential of the negative pole of the direct voltage source 3, and the right cascade element potential $\phi_{R1}$ is determined by the potential of the positive pole of the direct voltage source 3. Accordingly, corresponding to the specified direction convention, the cascade element voltage $U_1$ is equal to the negative direct voltage.

A transition from the S1-S2 unbiased switch state into the S3-S4 unbiased switch state via an S1-S4 or S2-S3 voltage-producing state is referred to as a falling switched mode. A corresponding transition in the opposite direction is referred to as a rising switched mode. The current rate of change in the load circuit is determined by the duration of the rising and the falling switched modes. In each switched mode, i.e. twice per switching period, the cascade element generates a voltage pulse of the cascade element voltage.

In another embodiment modifying the described method, in addition to the cited switch elements, additional switch elements are driven in the individual operating states of a cascade element. In preferred exemplary embodiments, the modulation of the cascade elements occurs according to the above cited U.S. Pat. No. 5,111,378. Here, in each direction of the load current, two switch elements situated opposite each other diagonally in the inverter bridge circuit are cycled periodically, and in addition, two switch elements situated in series in the bridge circuit are cycled in counter-phase. This drive method produces favorable characteristics given a change of current direction in the load circuit and given very small pulsewidths.

Figure 2:
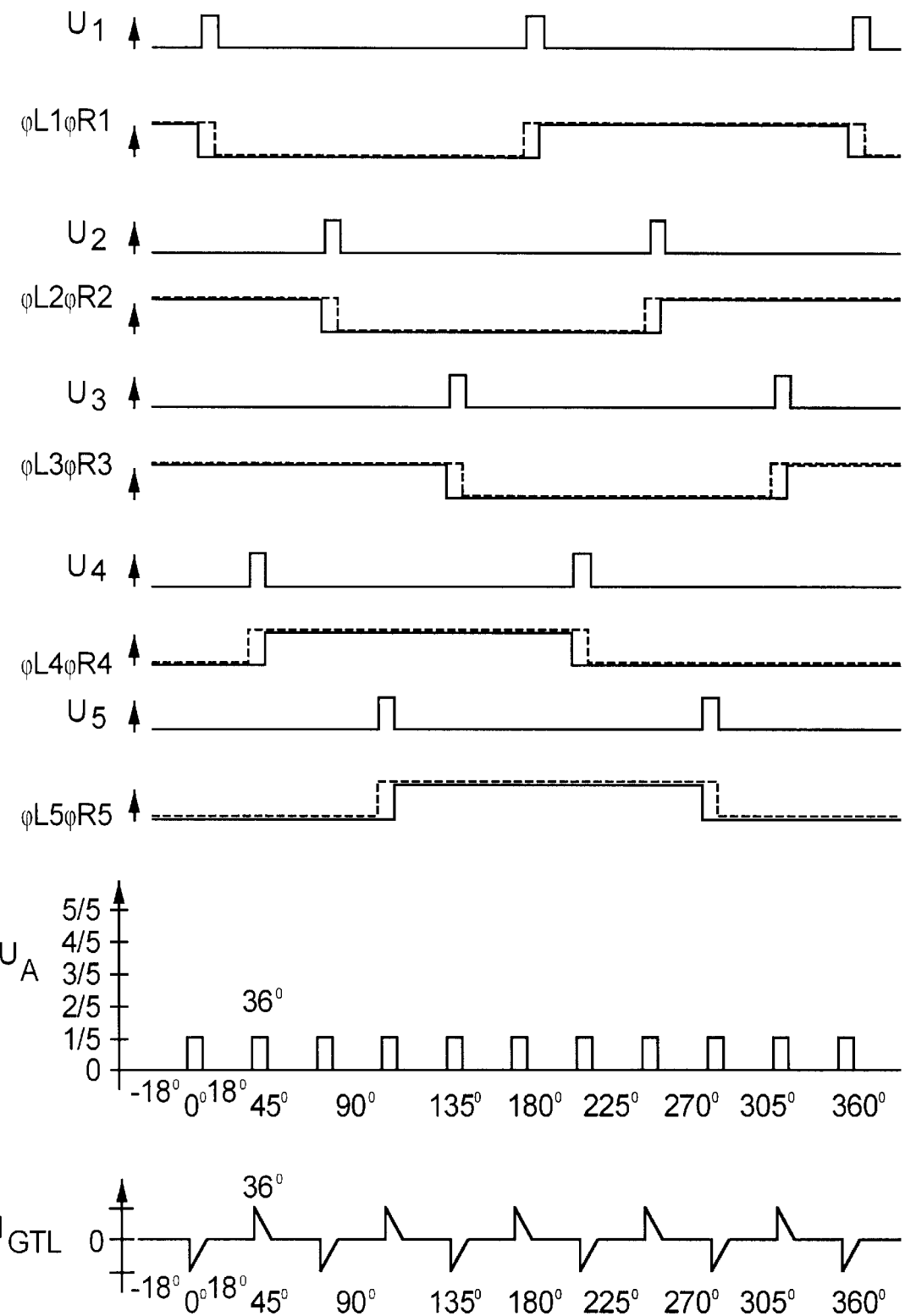
FIG. 2 shows voltage and current curves for the switching amplifier according to FIG. 1 with five switched cascade elements, given a small control factor of the output voltage and with staggered drive.

In FIGS. 2 to 9, a switching amplifier according to FIG. 1 with five switched cascade elements is depicted. In the underlying modulation method, each cascade element KE1 to KE5 generates two positive voltage pulses of the cascade element voltage $U_1$ to $U_5$ in each switching period during two S1-S4 voltage-producing states. These voltage pulses are depicted in the FIGS. 2 and 7 to 9 with a high level; and have a phase angle of 180° to one another. They are alternatively separated by an S1-S2 unbiased switch state and an S3-S4 unbiased switch state, respectively. During the unbiased switch states, the cascade elements are in a conductive state for the current flow in the load current. The unbiased switch states are illustrated in FIG. 2 and in FIGS. 7 to 9 by a low level of the cascade element voltages $U_1$ to $U_5$. In addition, the FIGS. 2 and 7 to 9 show the left and right cascade element potentials $\phi_{L1}$ to $\phi_{L5}$ and $\phi_{R1}$ to $\phi_{R5}$ of the cascade elements, whereby the left cascade element potentials $\phi_{L1}$ to $\phi_{L5}$ being illustrated with dotted lines, and the right cascade element potentials $\phi_{R1}$ to $\phi_{R5}$ being illustrated with solid lines.

FIG. 2 depicts characteristics of the cascade element voltages and of the cascade element potentials given a small control factor of the switching amplifier. The switching frequency of comparable switch elements is staggered 360°/5=72° from cascade element to cascade element. The allocation of the individual switch states to the characteristics is exemplarily detailed for the cascade element KE1, as an example. Before the 0° phase angle, the cascade element KE1 is in the S1-S2 unbiased switch state. The load circuit conducting through the cascade element KE1 is thus coupled with the positive pole of the direct voltage source 3. The cascade element potentials $\phi_{L1}$ and $\phi_{R1}$ are thus depicted with a high level. The cascade element voltage $U_1$ is thus ideally zero and is represented with a low level. Shortly before the 0° phase angle, the cascade element KE1 changes into the S1-S4 voltage-producing switch state. During the S1-S4 voltage-impressing state, the cascade element potentials $\phi_{L1}$ and $\phi_{R1}$ have different levels. The left cascade element potential $\phi_{L1}$ is determined by the positive pole of the direct voltage source 3 and is represented with a high level. The right cascade element potential $\phi_{R1}$ is determined by the minus pole of the direct voltage source and represented with a low level. The cascade element voltage $U_1$ is equal to the positive direct voltage and is represented with a high level. Immediately after the 0° phase angle, the cascade element KE1 changes into the S3-S4 unbiased switch state. The load circuit is thus connected to the negative pole of the direct voltage source 3 by the cascade element KE1. Accordingly, both the cascade element potentials $\phi_{L1}$ and $\phi_{R1}$ are represented with a low level, and the output voltage $U_1$ has a low level. Shortly before the 180° phase angle, the cascade element KE1 changes from the S3-S4 unbiased state into the S1-S4 voltage-producing state. The cascade element voltage and the cascade element potentials are represented with corresponding levels. Shortly after the 180° phase angle, the cascade element KE1 changes back into the S1-S2 unbiased switch state. The alternation between S1-S2 unbiased switch state, S1-S4 voltage-producing state, and S3-S4 unbiased switch state continues in a periodic manner. A corresponding alternation of the switch states, phase-shifted 72°, likewise takes place for the remaining cascade elements. This shift leads to the depicted output voltage $U_A$.

Each switched mode of a cascade element leads to charge reversals of the conductor-to-ground and coupling capacitances (FIG. 1) on the basis of the potential change. A common-mode charging current $I_{GTL}$ arises, which, absent filtering measures, is superimposed on the desired load current in the entire load circuit. A negative common-mode charging current pulse is caused by a falling switched mode, and a positive common-mode charging current pulse is caused by a rising switched mode.

In the exemplary embodiment of FIG. 2, the number of cascade elements, five, and their driving staggered 360°/5 lead to the illustrated common-mode charging current $I_{GTL}$, whose operational sign alternates from pulse to pulse, and whose base frequency equals five times the switching frequency. With the strict periodicity and the comparably high frequency of the common-mode charging current, the conditions for easy filtering of the common-mode charging current are satisfied.

For purposes of explanation, FIGS. 3 to 6 depict simplified representations of the switching amplifier according to FIG. 1 with five switched cascade elements, as well as a common-mode charging current $I_{GTL}$ corresponding to the switch states given phase angles of –18°, 0°, 18°, and 36° according to FIG. 2. The switch elements S1 to S4 of the cascade elements KE1 to KE5 are depicted as simple switches. Elements from FIG. 1 are depicted which are not needed for this explanation.

Figure 3:
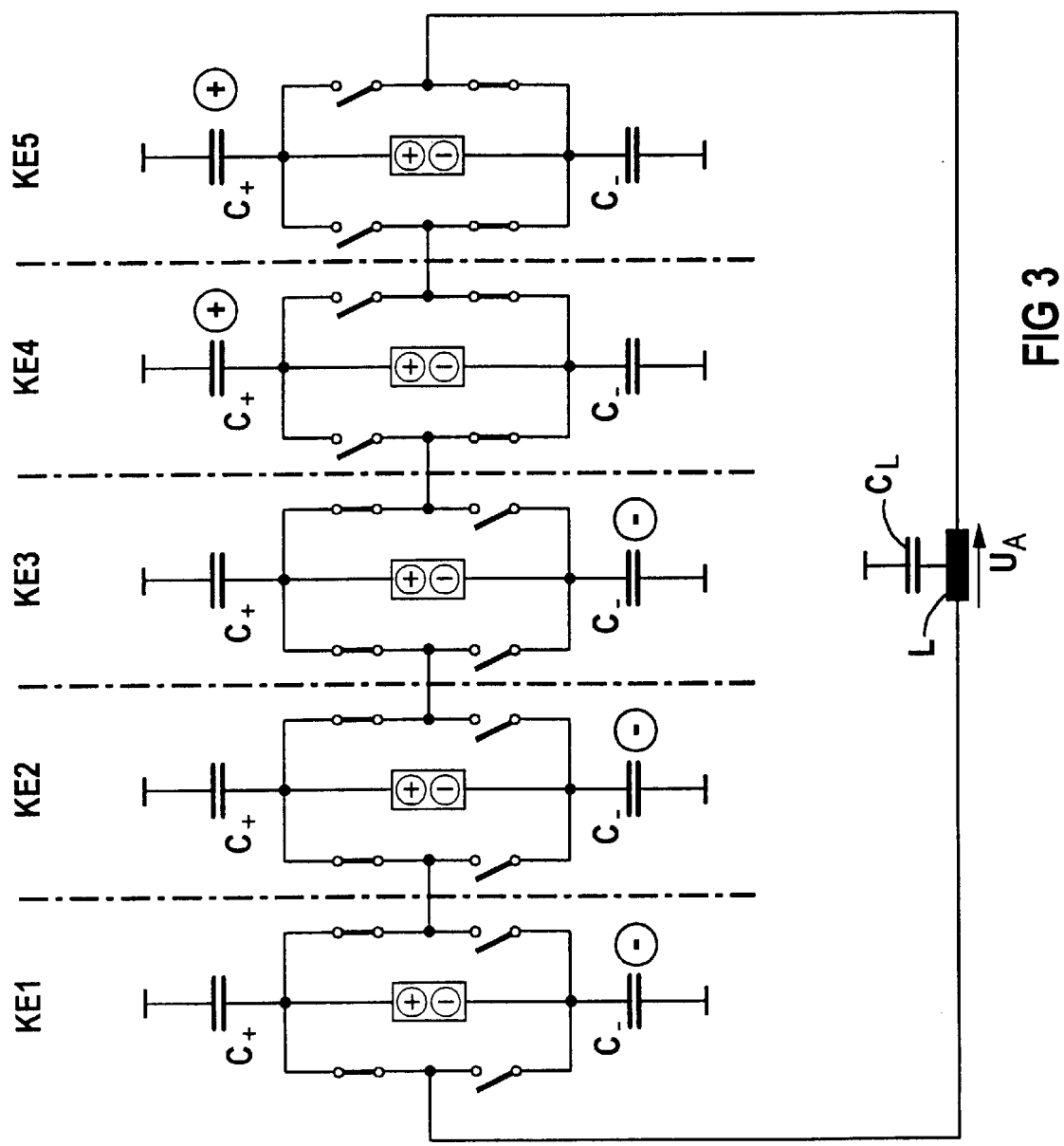
FIG. 3 is a simplified representation of FIG. 1 for a switching amplifier with five switched cascade elements, for a switch state according to FIG. 2 given a phase angle of −18°.

FIG. 3 depicts the switch state of the switching amplifier with five cascade elements given a phase angle of –18° according to FIG. 2. The cascade elements KE1 to KE3 are in the S1-S2 unbiased switch state, so that their capacitances $C_-$ are charged. Their charge is determined by the negative poles of the direct voltage sources 3. This is characterized in FIG. 3 with a corresponding e sign at the capacitances $C_-$. The cascade elements KE4 to KE5 are in the S3-S4 unbiased switch state, so that their capacitances $C_+$ are charged. Their charge is determined by the positive poles of the direct voltage sources 3. This is characterized with a corresponding ⊕ sign. The output voltage $U_A$ of the switching amplifier is equal to zero.

Figure 4:
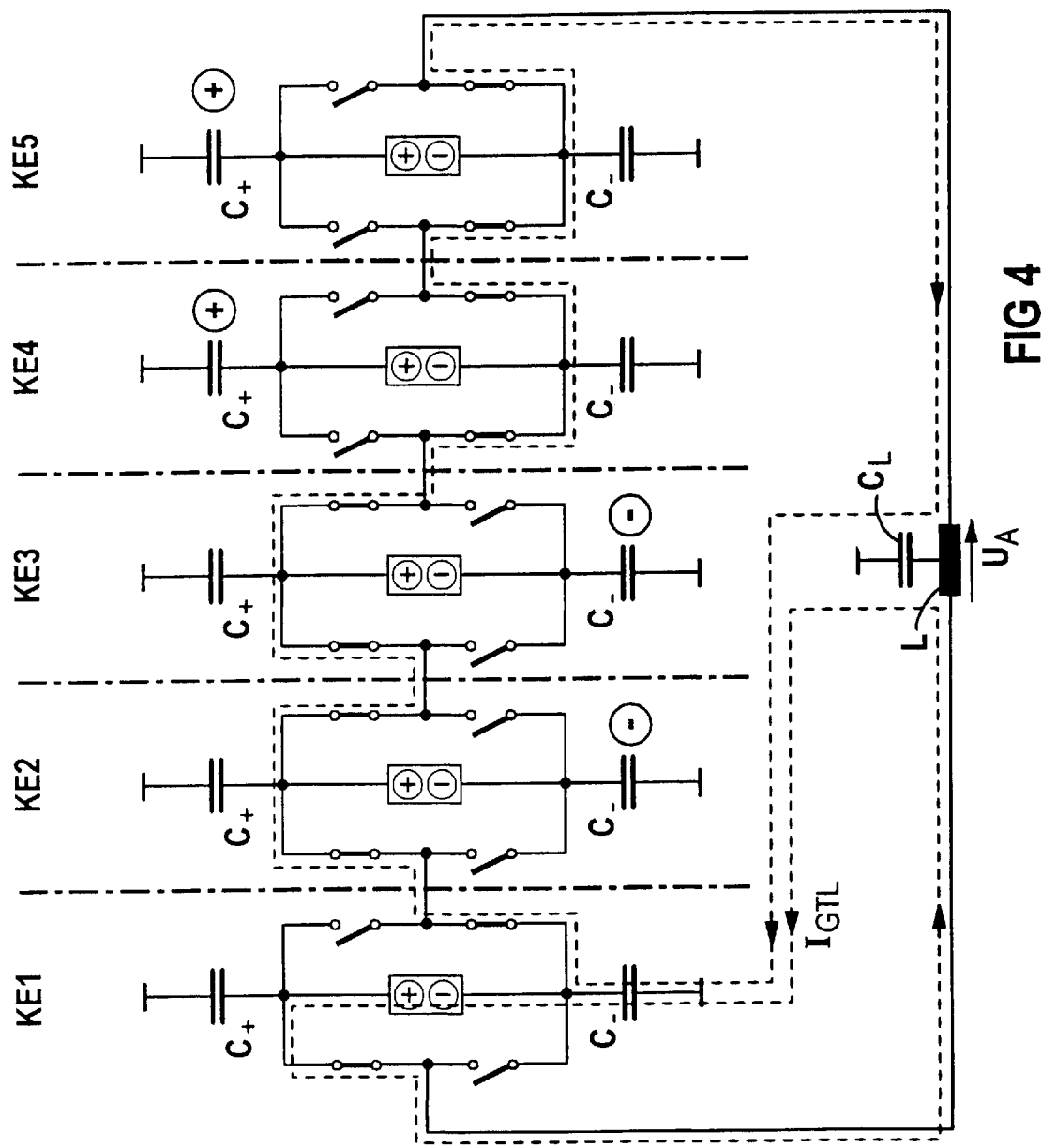
FIG. 4 is a simplified representation of FIG. 1, for a switching amplifier with five switched cascade elements as well as a common-mode charging current, for a switch state according to FIG. 2 given a phase angle of 0°.

FIG. 4 depicts the switch state of the switching amplifier with five cascade elements given a phase angle of 0° according to FIG. 2. Compared to the switch state according to FIG. 3, the cascade element KE1 has merely changed the switch state; it is in the S1-S4 voltage-producing state. In the S1-S4 voltage-producing state, the capacitance $C_-$, which was previously charged in the S1-S2 unbiased switch state, discharges via the load circuit and the capacitance $C_L$ of the load in the manner depicted. The capacitance $C_-$, is greater than the capacitances $C_+$ and $C_-$ by a multiple. During the S1-S4 voltage-producing state, the output voltage of the switching amplifier is equal to the direct voltage of the source of the cascade element KE1. This voltage drives a load current through the load L. Absent filtering, the common-mode charging current $I_{GTL}$ is superimposed on this load current.

Figure 5:
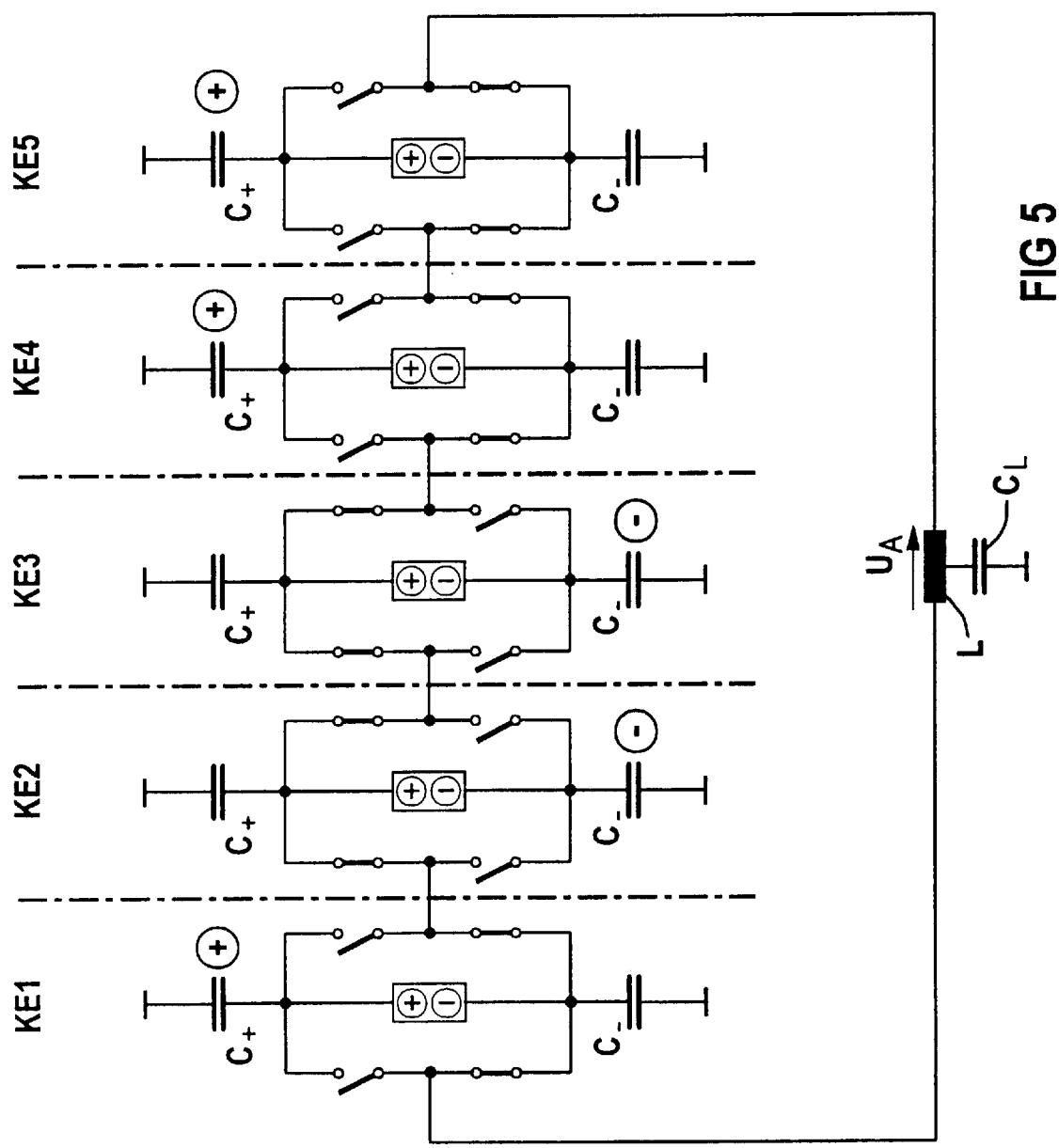
FIG. 5 is a simplified representation of FIG. 1 for a switching amplifier with five switched cascade elements, for a switch state according to FIG. 2 given a phase angle of 18°.

FIG. 5 depicts the switch state of the switching amplifier with five cascade elements given a phase angle of 18° according to FIG. 2. In contrast to FIG. 4, the cascade element KE1 is in the S3-S4 unbiased switch state. The capacitances $C_+$ and $C_-$ are charged corresponding to the unbiased states. The output voltage of the switching amplifier is equal to zero, and there is no common-mode charging current that flows.

Figure 6:
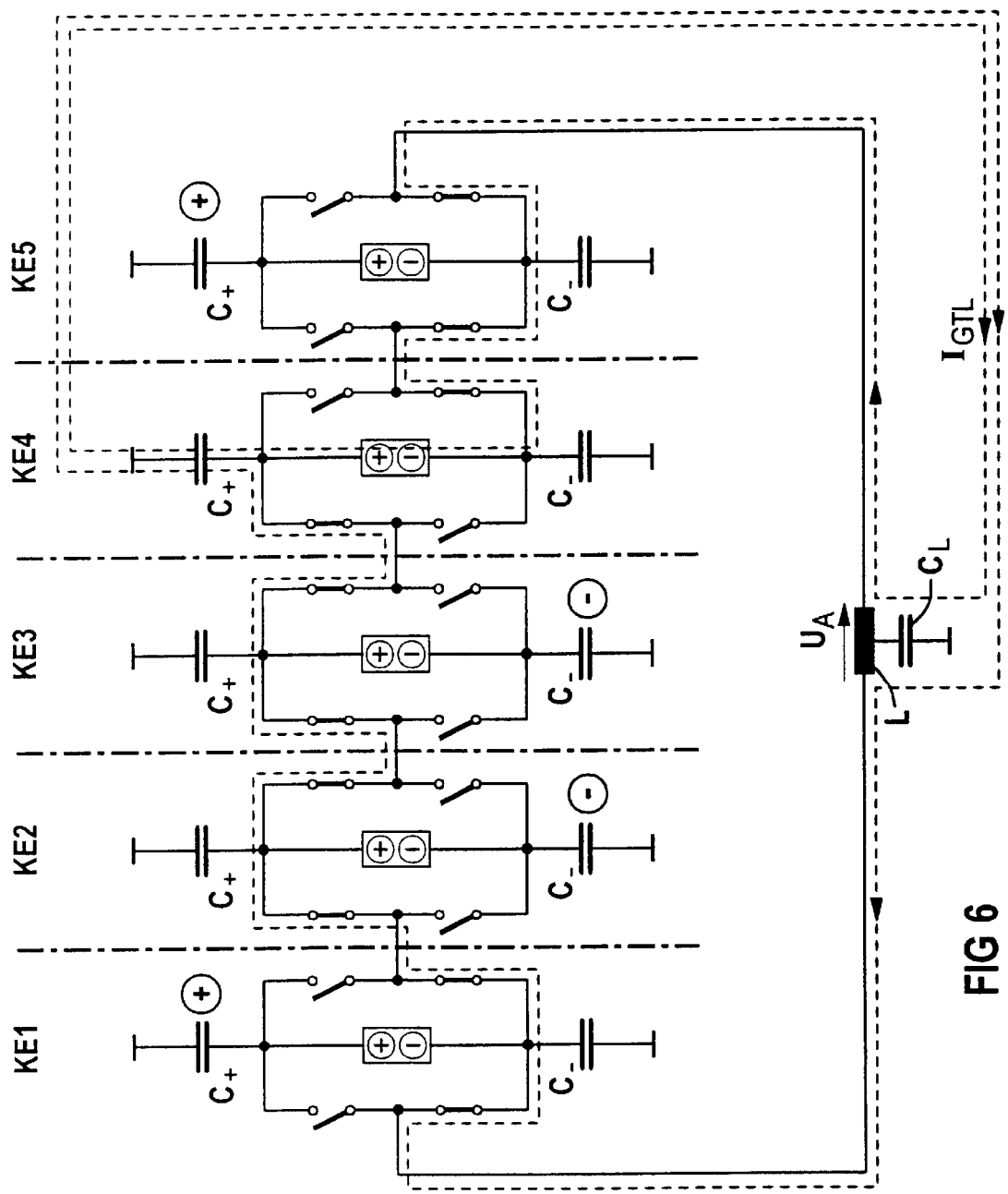
FIG. 6 is a simplified representation of FIG. 1, for a switching amplifier with five switched cascade elements as well as a common-mode charging current, for a switch state according to FIG. 2 given a phase angle of 36°.

FIG. 6 depicts the switch state of the switching amplifier with five cascade elements given a phase angle of 36° according to FIG. 2. Compared to FIG. 5, the cascade element KE4 has changed switch states; it is in the S1-S4 voltage-producing state. The previously charged capacitance $C_+$ discharges via the load circuit and causes the common-mode charging current $I_{GTL}$, in the manner depicted. Because the capacitance $C_+$ of the cascade element KE4 is charged with the opposite polarity relative to the capacity $C_-$ of the cascade element from FIG. 4, the common-mode charging current has the opposite direction from FIG. 4. Again, the common mode charging current is superimposed on the load current driven by the direct voltage of the cascade element KE4, absent filtering.

Figure 7:
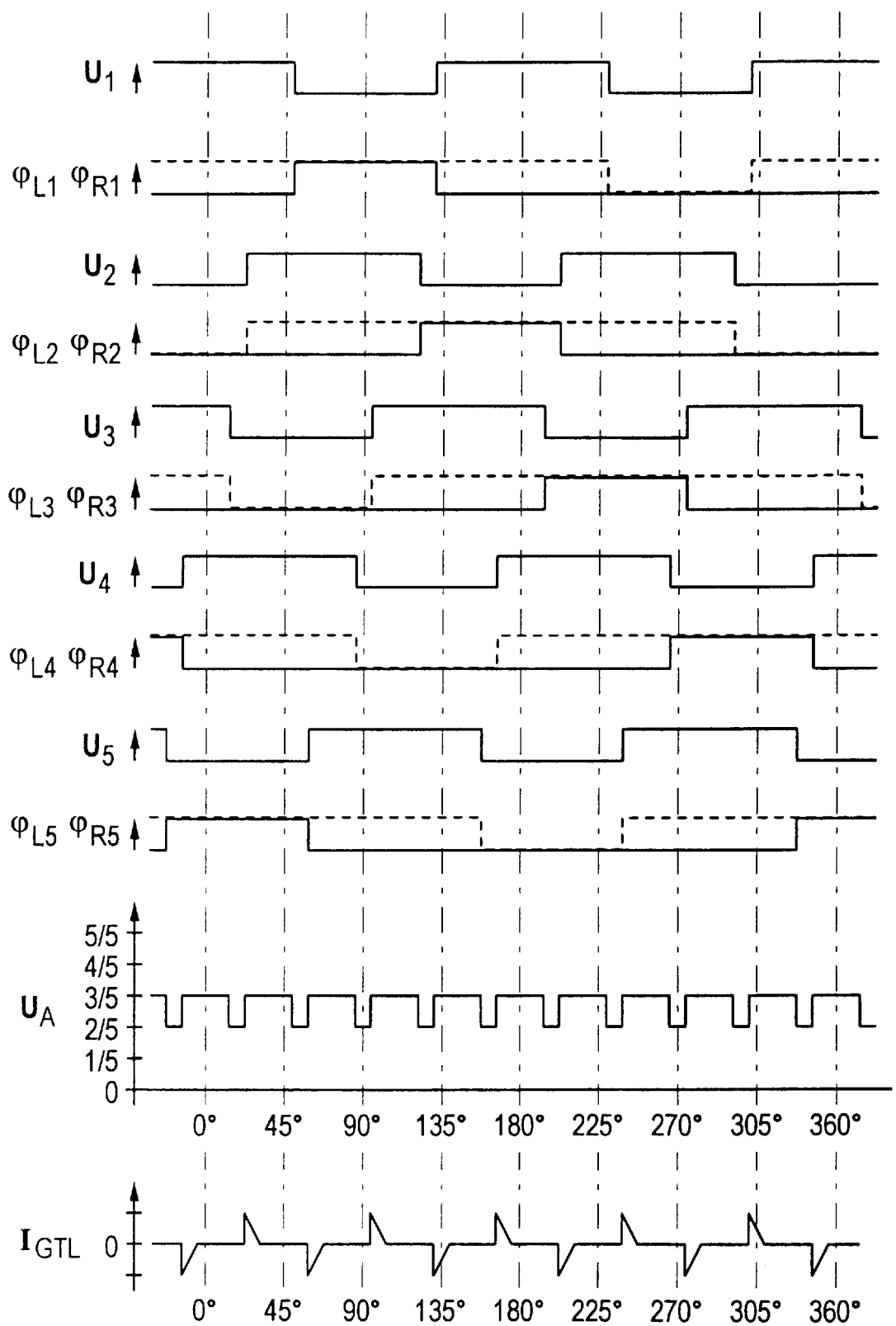
FIG. 7 shows voltage and current curves of the switching amplifiers according to FIG. 1, with five switched cascade elements, with a larger control factor of the output voltage and with staggered drive.

FIG. 7 depicts characteristics of the cascade element voltages and the cascade element potentials given a greater control factor of the switching amplifier. A larger output voltage $U_A$ of the switching amplifier thus is set. The S1-S4 voltage-producing states are appreciably longer compared to FIG. 2. In addition, an overlapping of the S1-S4 voltage-producing states of the individual cascade elements takes place, so that the depicted output voltage $U_A$ of the switching amplifier is generated. Due to the staggered drive of the individual cascade elements by 360°/5, the common-mode charging current $I_{GTL}$ remains the same relative to FIG. 2 with respect to periodicity and base frequency, even given this higher control factor of the switching amplifier. Accordingly, the conditions for easy filtering of the common-mode charging current are maintained.

Figure 8:
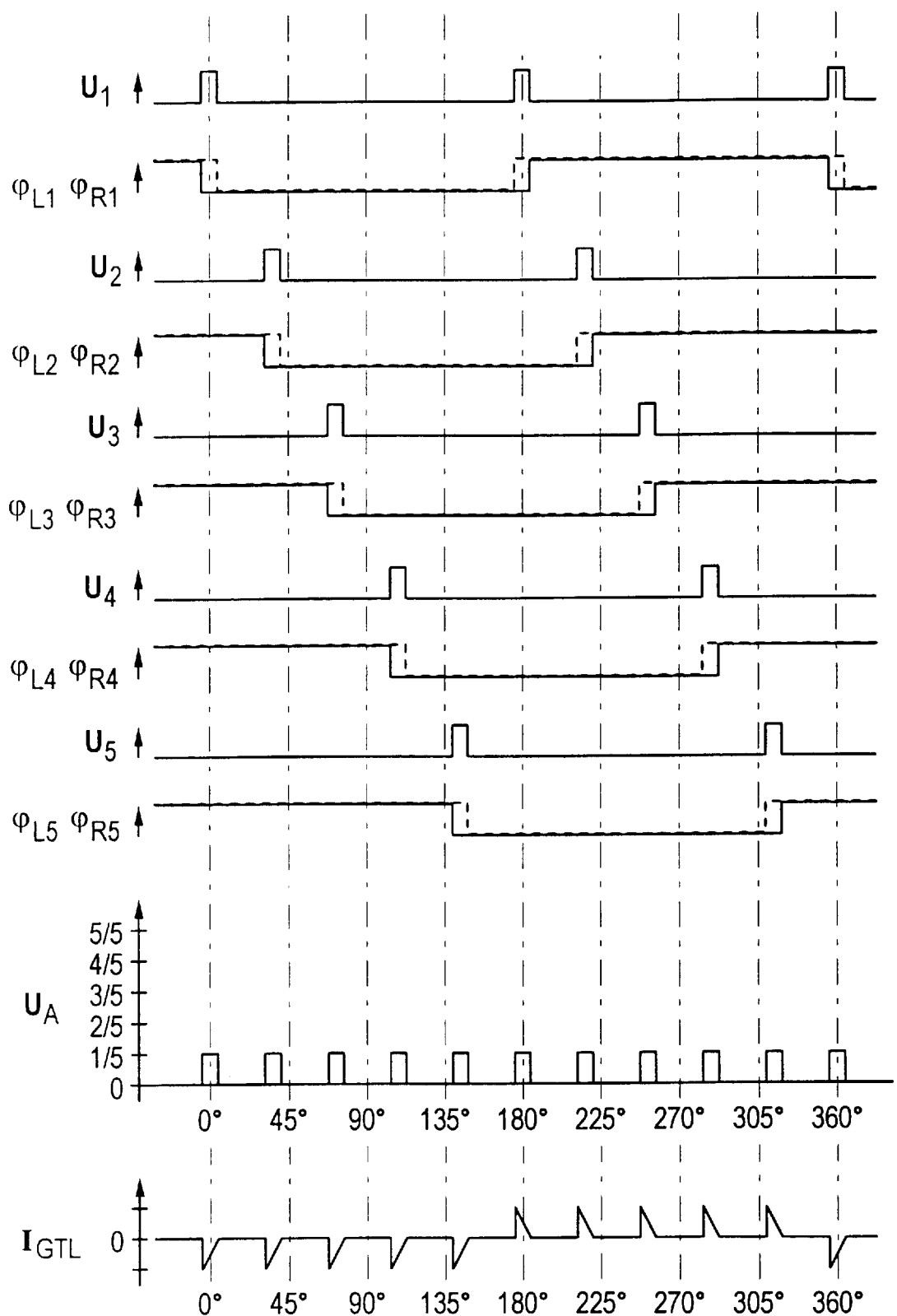
FIG. 8 in contrast to the invention, for purposes of illustration, shows voltage and current curves of the switching amplifier according to FIG. 1 with five switched cascade elements, with a small control factor of the output voltage and without the staggered drive.

For comparison, FIG. 8 depicts, contrary to the invention, curves of the voltages and potentials of the cascade elements of the switching amplifier with five switched cascade elements whereby the same output voltage $U_A$ is generated as in FIG. 2. However, the switching frequency of comparable switch elements is not shifted from cascade element to cascade element by 360°/5 relative to each other, in accordance with the above embodiment of the invention, but merely by 180°/5=36°. The common-mode charging current $I_{GTL}$ now has five pulses of the same polarity in sequence and thus contains the switching frequency of the switch elements as a fundamental oscillation (component). Effective filtering is thereby made more complicated.

Figure 9:
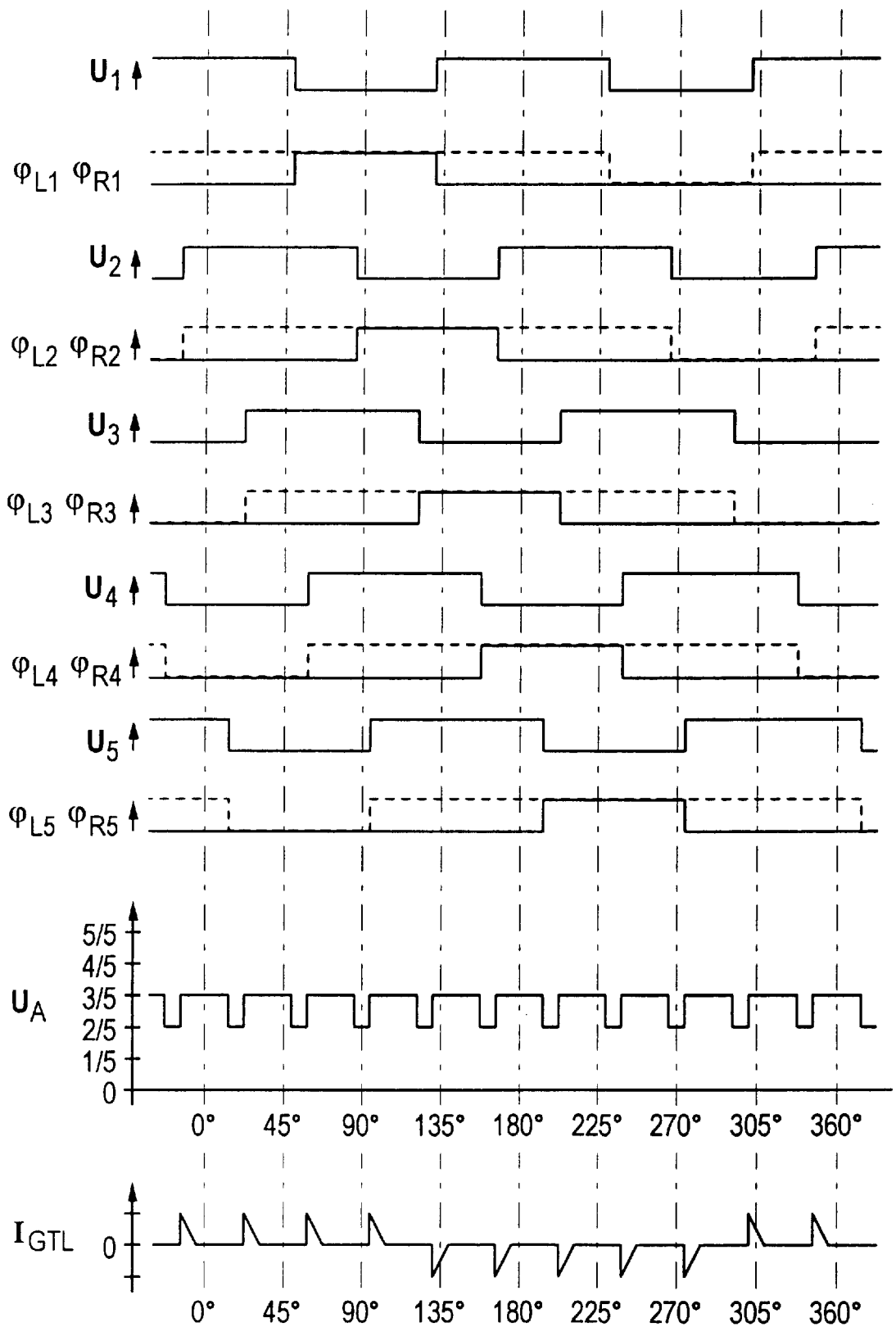
FIG. 9 in contrast to the invention, for purposes of illustration, shows voltage and current curves of the switching amplifier according to FIG. 1 with five switched cascade elements, given a larger control factor of the output voltage and without staggered drive.

For purposes of comparison, FIG. 9 depicts, contrary to the invention, voltage curves of the switching amplifier with five switched cascade elements, the same output voltage $U_A$ being generated as in FIG. 7. However, the switching frequency of comparable switch elements is not shifted from cascade element to cascade element by 360°/5 relative to one another, in accordance with the above embodiment of the invention, but merely by 180°/5=36°. The common-mode charging current $I_{GTL}$ has five pulses of the same polarity in sequence and contains the switching frequency of a switch element as base oscillation. This complicates effective filtering.

Figure 10:
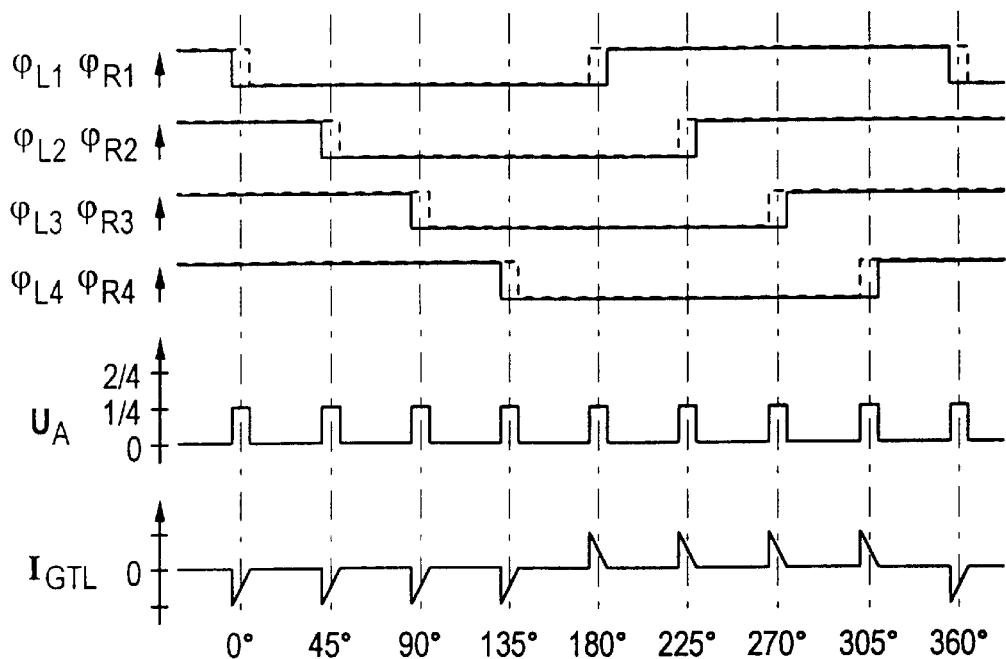
FIG. 10 in contrast to the invention, for purposes of illustration, shows voltage and current curves of the switching amplifier according to FIG. 1 with four switched cascade elements, with a first staggering of the drive.
Figure 11:
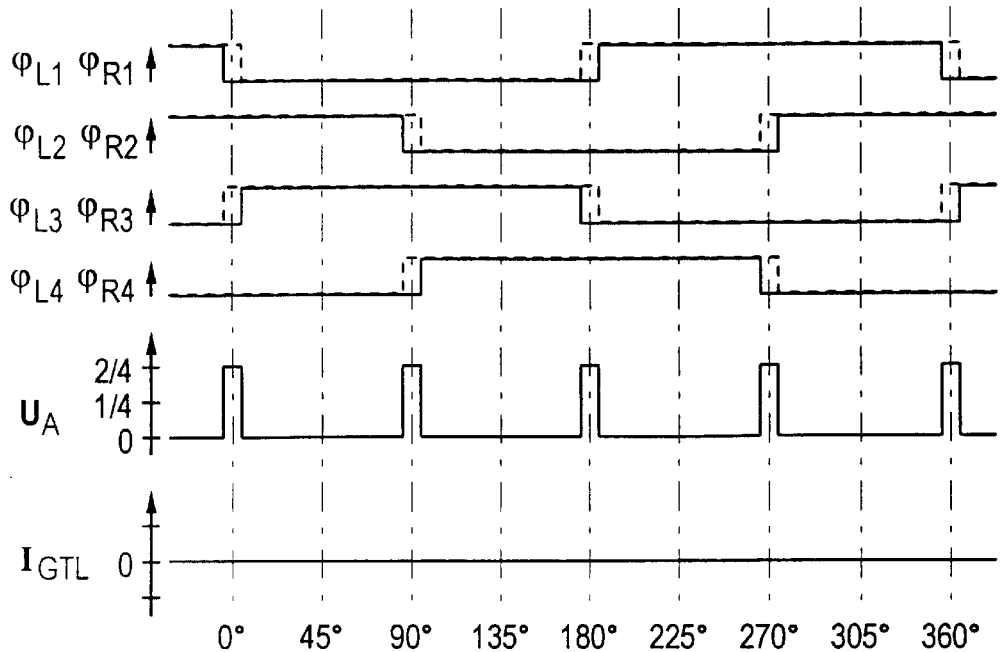
FIG. 11 in contrast to the invention, for purposes of illustration, shows voltage and current curves of the switching amplifier according to FIG. 1 with four switched cascade elements, with a second staggering of the drive.
Figure 12:
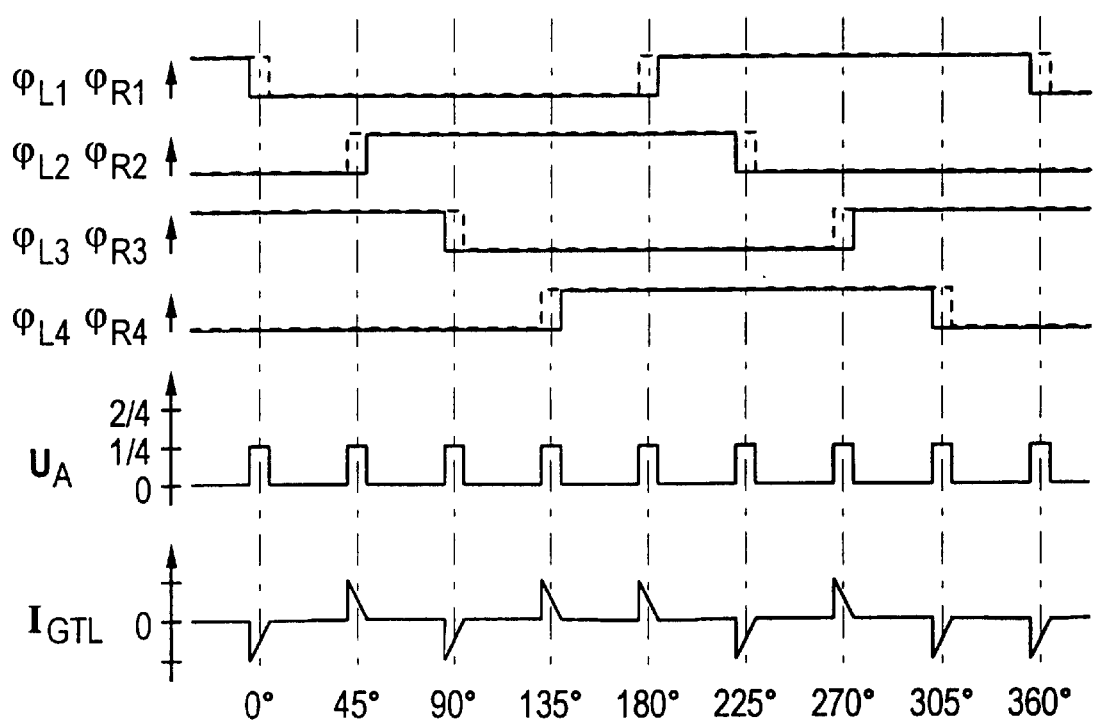
FIG. 12 in contrast to the invention, for purposes of illustration, shows voltage and current curves of the switching amplifier according to FIG. 1 with four switched cascade elements, with a third staggering of the drive.

For purposes of comparison, FIGS. 10 to 12 depict, contrary to the invention, curves of a switching amplifier having four switched cascade elements. The cascade potentials, the output voltage $U_A$ and the common-mode charging current are depicted, the left cascade element potentials $\phi_{L1}$ to $\phi_{L4}$ being illustrated with dotted lines, and the right cascade element potentials $\phi_{R1}$ to $\phi_{R4}$ being illustrated with solid lines.

FIG. 10 depicts characteristics of the amplifier with four switched cascade elements, wherein the switching frequency of comparable switch elements is shifted 180°/4=45° from cascade element to cascade element. The common-mode charging current $I_{GTL}$ has four pulses of the same polarity in sequence and thus contains the switching frequency of the cascade elements as base oscillation. This complicates effective filtering.

In FIG. 11, the shift of the switching frequency of comparable switch elements is 360°/4=90° from cascade element to cascade element. Since two cascade elements always switch in opposite directions simultaneously, the common-mode charging current equals zero. However, given this driving of the cascade elements, the effective switching frequency of the output voltage $U_A$ is not quadrupled, but merely doubled. Likewise, the voltage jumps of the output voltage $U_A$ are relatively high, namely equal to twice the operating voltage of a cascade element. Both of these characteristics of the output voltage $U_A$ complicate their filtering.

Finally, FIG. 12 depicts characteristics of the switching amplifier with four switched cascade elements and a drive method wherein the shift of the switching frequency of comparable switch elements is 45° from cascade element to cascade element, with the cascade elements KE2 and KE4 are driven in an inverted manner. To maintain the same output voltage $U_A$ as in FIG. 10, the output terminals of these two cascade elements are reversed relative to the illustration in FIG. 1. In this drive method, the output voltage $U_A$ has the desired values with respect to the effective switching frequency and the voltage range. The pulses of the common-mode charging current $I_{GTL}$ change their sign from pulse to pulse within a half-period of 180°, but a phase jump of 45° arises after each half-period, which complicates effective filtering.

Although modifications and changes may be suggested by those skilled in the art, it is the intention of the inventors to embody within the patent warranted hereon all changes and modifications as reasonably and properly come within the scope of their contribution to the art.

We claim as our invention:

1. A switching amplifier comprising:
   a plurality n of successively-connected cascade elements, each of said cascade elements being substantially identical, said plurality of cascade elements being odd and greater than or equal to three;
   each of said cascade elements containing a single phase, controlled power inverter bridge comprised of switch elements; and
   a control device connected to the respective switch elements in the respective power inverters in the respective cascade elements, said control device operating all of said switch elements with a uniform switching frequency, having a switching period associated therewith, by pulse width modulation, and said control device operating respective, comparable switch elements of the respective cascade elements to drive said respective, comparable switch elements offset from cascade element-to-cascade element by 1/n times said switching period, thereby generating a common-mode charging current in said cascade elements which is easily filterable.

2. A switching amplifier as claimed in claim 1 wherein each power inverter bridge is at a floating potential.

3. A switching amplifier as claimed in claim 1 wherein each cascade element contains a direct voltage source connected to the power inverter bridge in that cascade element, said direct voltage source being at a floating potential.

4. A switching amplifier as claimed in claim 3 wherein each direct voltage source has a rated voltage and an energy output, said rated voltage and said energy output being the same for each direct voltage source.

5. A switching amplifier as claimed in claim 1 wherein each power inverter bridge contains at least one power semiconductor switch as one of said switch elements.

6. A switching amplifier as claimed in claim 5 wherein said power semiconductor switch comprises a transistor selected from the group of transistors consisting of power transistors and insulated gate bipolar transistors.

7. A switching amplifier as claimed in claim 1 wherein said control device controls said cascade elements so that an output voltage of each of said cascade elements has two voltage pulses during a switching period.

8. A switching amplifier as claimed in claim 1 wherein said control device controls said cascade elements so that each power inverter bridge has a voltage-producing state, a first unbiased switch state, a further voltage-producing state, and a second unbiased switched state during a switching period.

9. A method for operating a switching amplifier comprising the steps of:

provided plurality greater than or equal to three of successively-connected cascade elements;

providing a single-phase, controlled power inverter bridge with switch elements in each cascade element;

operating an odd plurality n greater than or equal to three of said cascade elements in a switched mode;

driving the switch elements of the respective bridges in the respective cascade elements which are operated in said switched mode with a uniform switching frequency, having a switching period associated therewith, by pulse width modulation; and staggering driving of respective, comparable switch elements from cascade element-to-cascade element which are operated in said switched mode by 1/n times the switching period, to produce a common-mode charging current in all of said cascade elements which is easily filterable.

10. A method as claimed in claim 9 comprising providing all cascade elements which are operated in said switched mode which contribute equally to an output voltage of said switching amplifier.

11. A method as claimed in claim 9 comprising controlling each cascade element which is operated in said switched mode so that an output voltage of said cascade element has two voltage pulses during a switching period.

12. A method as claimed in claim 9 comprising controlling each cascade element which is operated in said switched mode so that the power inverter bridge therein has a voltage-producing state, a first unbiased switch state, a further voltage-producing state and a second unbiased state during a switching period.

* * * * *